United States Patent
Hong et al.

(10) Patent No.: US 8,859,441 B2
(45) Date of Patent: Oct. 14, 2014

(54) METHOD AND SYSTEM FOR MANUFACTURING SEMICONDUCTOR DEVICE

(76) Inventors: Ming-Hwei Hong, Taipei (TW); Ray-Nien Kwo, Hsinchu (TW); Tun-Wen Pi, Hsinchu (TW); Mao-Lin Huang, Hsinchu (TW); Yu-Hsing Chang, Hsinchu (TW); Pen Chang, Hsinchu (TW); Chun-An Lin, Hsinchu (TW); Tsung-Da Lin, Taipei (TW)

( * ) Notice: Subject to any disclaimer, the term of this patent is extended or adjusted under 35 U.S.C. 154(b) by 289 days.

(21) Appl. No.: 13/439,888

(22) Filed: Apr. 5, 2012

(65) Prior Publication Data

US 2013/0267077 A1    Oct. 10, 2013

(51) Int. Cl.
*H01L 21/31* (2006.01)

(52) U.S. Cl.
USPC ............ 438/778; 438/785; 438/909; 438/913

(58) Field of Classification Search
CPC .................................................. H01L 21/0228
USPC ................ 438/778, 785, 909, 913, FOR. 395
See application file for complete search history.

(56) References Cited

U.S. PATENT DOCUMENTS

| | | | |
|---|---|---|---|
| 7,550,749 B2 * | 6/2009 | Caliendo et al. | 250/492.21 |
| 8,110,511 B2 * | 2/2012 | Lei et al. | 438/800 |
| 2010/0147396 A1 * | 6/2010 | Yamagishi et al. | 137/15.01 |
| 2012/0058630 A1 * | 3/2012 | Quinn et al. | 438/483 |
| 2013/0143415 A1 * | 6/2013 | Yudovsky et al. | 438/765 |
| 2013/0200518 A1 * | 8/2013 | Ahmed et al. | 257/750 |
| 2013/0280918 A1 * | 10/2013 | Ahmed | 438/763 |
| 2013/0341679 A1 * | 12/2013 | Green et al. | 257/192 |

* cited by examiner

*Primary Examiner* — George Fourson, III
(74) *Attorney, Agent, or Firm* — The PL Law Group, PLLC

(57) ABSTRACT

The present invention provides a system and method for manufacturing a semiconductor device including a substrate and a high-κ dielectric layer on the substrate. The system comprises a modular track; a substrate-forming chamber connected with the modular track for forming the substrate; and an atomic layer deposition (ALD) chamber connected with the modular track for providing the high-κ dielectric layer.

6 Claims, 9 Drawing Sheets

US 8,859,441 B2

METHOD AND SYSTEM FOR MANUFACTURING SEMICONDUCTOR DEVICE

FIELD OF THE INVENTION

The present invention relates to a method and system for manufacturing semiconductor device, and more particularly to a method and system for manufacturing semiconductor device by using in-situ atomic-layer-deposition method.

BACKGROUND OF THE INVENTION

As the downscaling of Si-based MOSFETs, the $SiO_2$ gate oxide thickness is correspondingly reduced to be close to the quantum tunneling limit of 1.0 nm. Beyond this point, electrons tunneling through this insulating layer will give unacceptably large electric leakage currents. $HfO_2$-based high-κ dielectric was introduced to replace $SiO_2$ in 45 nm CMOS technology as the solution to this issue. Moreover, to extend the Moore's Law beyond 15 nm node, it is adamant that III-V high electron mobility semiconductors integrated with high K gate dielectrics has to be employed.

Currently, the chemical vapor deposition (CVD), the atomic layer deposition (ALD), the metal organic chemical vapor deposition (MOCVD), the pulsed-laser deposition (PLD), sputtering, the molecular beam epitaxy (MBE) and so on are methods commonly used for forming a high dielectric constant film. Atomic layer deposition (ALD) is considered as one deposition method with the greatest potential for producing very thin, conformal films with control of the thickness and composition of the films possible at the atomic level. A major driving force for the recent interest is the prospective seen for ALD in scaling down microelectronic devices. However, when a stacked structure of the high-κ dielectric film and the substrate is formed by using the abovementioned methods, there exists a problem that an interface between the high-κ dielectric film and the substrate is always exposed to the atmosphere, which may cause the generation of the native oxide layer on the substrate, thereby giving adverse effects on the electric characteristics. Accordingly, a high-quality oxide/substrate interface is required for realizing high performance of MOSFETs.

The native oxides of III-V semiconductors, unlike $SiO_2$ on Si, are leaky and do not perform high quality native III-V oxides/III-V semiconductors interfaces. Ex-situ chemical treatment using $HCl+(NH_4)_2S$ is considered as the method most commonly used to remove native oxides and passivate III-V surface prior to the deposition of high-κ dielectrics. However, the method is not able to completely remove the native oxides. Moreover, the residual sulfur at oxide/semiconductor interface is thermally unstable and is adverse to the source/drain activation in MOSFET fabrication.

Hence, because of the defects in the prior arts, the inventors provide a method and system for manufacturing semiconductor devices to effectively overcome the demerits existing in the prior arts.

SUMMARY

Since high-quality interfaces between the oxide layer and the semiconductor layer are the key for realizing high performance MOSFETs, a method and system for manufacturing semiconductor devices with the high-quality interfaces by using the in-situ approach are provided, wherein no surface treatments are employed. Based on the method and system provided in the present invention, the electrical properties of the high-κ dielectric film on semiconductors, in particular III-V compound semiconductors, including the capacitance-voltage (C-V) characteristics, the density of defects at the interface ($D_{it}$) and the leakage current, and the EOT are all improved.

In accordance with one aspect of the present invention, a system for manufacturing a semiconductor device including a substrate, e.g. a III-V epi-layer, and a dielectric layer, e.g. a metal-oxide layer made of high-κ dielectrics, on the substrate is provided. The system comprises a modular track; a substrate-forming chamber, e.g. an epitaxial III-V layer-growing chamber, connected with the modular track for forming the substrate; and an atomic layer deposition (ALD) chamber connected with the modular track for providing the dielectric layer.

In accordance with another aspect of the present invention, a system for manufacturing a semiconductor device including a substrate and a first dielectric layer on the substrate is provided. The system comprises a substrate-forming chamber for forming the substrate; and an atomic layer deposition (ALD) chamber connected with the substrate-forming chamber for providing the first dielectric layer.

In accordance with a further aspect of the present invention, a method for manufacturing a semiconductor device is provided. The method comprises steps of: forming a substrate; and forming a first dielectric layer on the substrate in an atomic layer deposition (ALD) chamber, wherein the formed substrate is kept in vacuum before forming the first dielectric layer.

The above objects and advantages of the present invention will become more readily apparent to those ordinarily skilled in the art after reviewing the following detailed descriptions and accompanying drawings, in which:

DETAILED DESCRIPTION

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
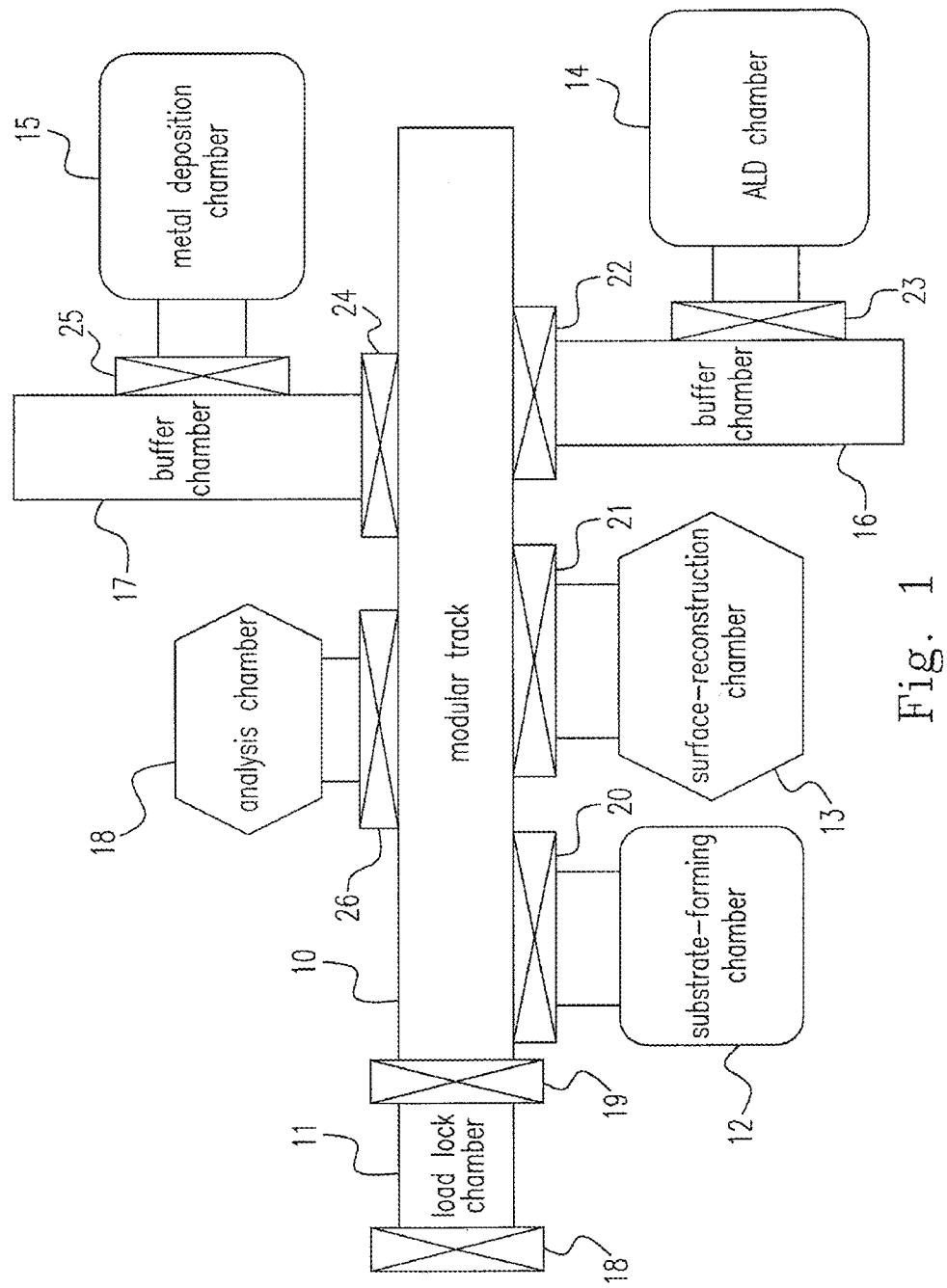
FIG. 1 is a diagram showing a semiconductor manufacturing system according to a first embodiment of the present invention.

Please refer to FIG. 1, which is a diagram showing a semiconductor manufacturing system according to a first embodiment of the present invention. The system is a multi-chamber system where all chambers are connected with a modular track 10 selectively via valves 18, 19, 20, 21, 22, 23, 24, 25 and 26. In the modular track 10 having a pressure ranged from $10^{-9}$ to $10^{-11}$ Torr, at least one wafer is transferred into/out of the respective chambers on a wafer stage by at least one wafer transfer arm (not shown). The system mainly includes chambers such as a load lock chamber 11 whose atmospheres are changeable between ultra high vacuum and atmospheric pressure, a substrate-forming chamber 12 for growing a substrate, and an atomic layer deposition (ALD) chamber 14 for depositing a first high-κ dielectric layer on the substrate by the ALD method. The substrate for semiconductor devices could be formed from silicon, compound III-V or II-VI materials, wherein a III-V group compound semiconductor material includes a III group chemical element and a V group chemical element, the III group chemical element includes one selected from a group consisting of B, Al, Ga, In and Tl, and the V group chemical element includes one selected from a group consisting of N, P, As, Sb and Bi. Particularly, the substrate could be formed from Si, SiO$_2$, GaN, InGaN, AlN, sapphire, spinnel, SiC, GaAs, InGaAs, InAs, Al$_2$O$_3$, InP, and a combination thereof Epitaxial silicon is usually grown using vapor-phase epitaxy (VPE), a modification of the chemical vapor deposition. Molecular-beam epitaxy (MBE), liquid-phase epitaxy (LPE), and MOCVD are also used, mainly for compound semiconductors. Based on the above, it could be known that the devices configured in the substrate-forming chamber 12 are depending on the material of the substrate and the technology to be adopted for forming the substrate. Preferably, the substrate-forming chamber 12 is an MBE or MOCVD chamber for the epitaxy of the III-V compounds. The first high-κ dielectric layer includes a high-κ dielectric material including one selected from a group consisting of HfO$_2$, HfO$_2$-based dielectrics, ZrO$_2$, Al$_2$O$_3$, TiO$_2$, Sc$_2$O$_3$, La$_2$O$_3$, SrTiO$_3$, LaAlO$_3$, Y$_2$O$_3$, Ga$_2$O$_3$, Gd$_2$O$_3$, SiN and a combination thereof.

Preferably, the ALD chamber 14 is connected with the modular track 10 via a buffer chamber 16, which is kept at a pressure in a range of $10^{-5}$~$10^{-11}$ Torr, and two valves 22, 23 are respectively configured between the modular track 10 and the buffer chamber 16 and between the buffer chamber 16 and the ALD chamber 14. The ALD chamber 14 is preferably further connected with a vacuum pump (not shown) for controlling a pressure in the ALD chamber 14. Since ALD is based on the sequential use of a gas phase chemical process and the pressure in the ALD chamber 14 just could be pumped down to $5\times10^{-9}$ Torr, the configuration of the buffer chamber 16 and the valves 22, 23 could not only avoid chemical agents or water vapor used during the ALD process entering the modular track 10, but also maintain the ultrahigh vacuum (about $5\times10^{-10}$ torr) in the modular track 10. Preferably, the abovementioned connections such as the connection between the ALD chamber 14 and the buffer chamber 16 are achieved via ConFlat (CF) flanges which use metal gaskets (e.g. a copper gasket) and knife-edge flanges instead of the traditional elastomeric O-rings to achieve the ultrahigh vacuum seal. Each face of the two mating CF flanges has a knife edge which cuts into the softer metal gasket, providing an extremely leak-tight, metal-to-metal seal. Deformation of the metal gasket fills small defects in the flange, allowing the CF flanges operate down to $10^{13}$ Torr pressure. The gasket is partially recessed in a groove in each flange.

Selectively, the system could further include a surface-reconstruction chamber 13 and/or an annealing chamber (not shown in FIG. 1) connected with the modular track 10. Selectively, the system could further include an X-ray photoelectron spectroscopy (XPS) analysis chamber 18 and/or other analysis chambers connected with the modular track 10 for probing chemical/physical characteristics of a surface of a substrate (e.g. GaAs) and interfaces between the high-κ dielectric layer and the substrate (e.g. ALD-Al$_2$O$_3$/GaAs), and/or a metal deposition chamber 15 connected with the modular track 10 for forming one or more metal layers on the high-κ dielectric layer. Preferably, the metal deposition chamber 15 could be connected with the modular track 10 via a buffer chamber 17 and two valves 24, 25 that may have function similar to that of the buffer chamber 16 and valves 22 and 23.

Figure 2:
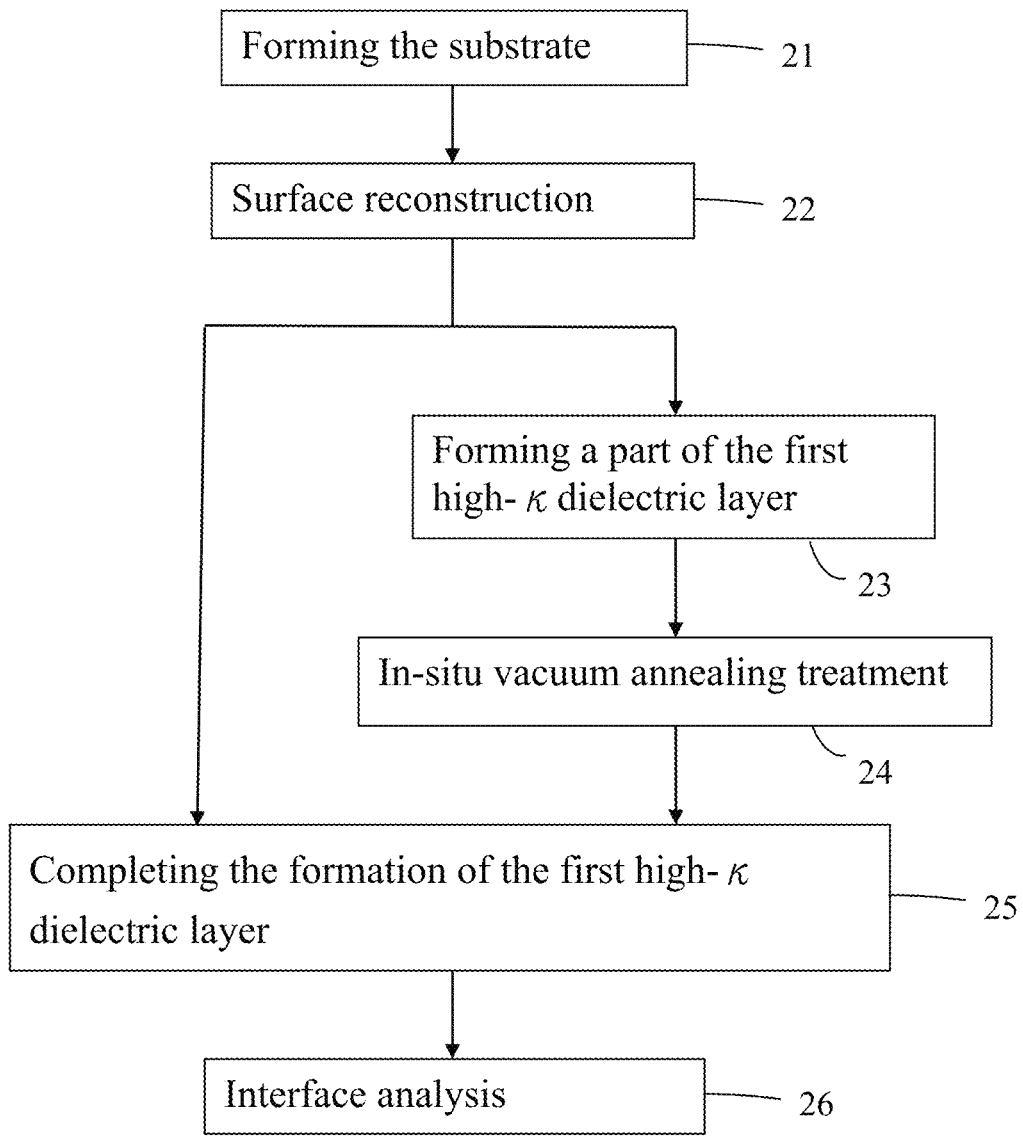
FIG. 2 is a flow chart showing a method for manufacturing a semiconductor device according to a second embodiment of the present invention.

Please refer to FIG. 2, which is a flow chart showing a method for manufacturing a semiconductor device according to a second embodiment of the present invention. The method is performed by using a system according to the first embodiment shown in FIG. 1. Firstly, after the load lock chamber 11 is evacuated to vacuum, the commercial single crystal compound semiconductor wafers (e.g. 2" n-GaAs(001) wafers) in the load lock chamber 11 is transferred to the substrate-forming chamber 12 through the modular track 10 by a transfer arm. Then, a substrate is formed in the substrate-forming chamber 12 using any technologies known in this field, such as MBE, which comprises sub-steps of removing a native oxide layer, if there is any, from the surface of the wafer by heat and growing epitaxial compound semiconductor layers (e.g. the Si doped n-type GaAs epi-layer) on said surface at a pressure ranged from $10^{-6}$~$10^{-11}$ Torr, particularly $10^{-8}$~$10^{-9}$ Torr, so as to form the substrate (Step 21). In addition, the substrate-forming chamber 12 cannot be filled with any inert gas under any circumstance. Afterwards, the samples are, without breaking the vacuum, in-situ transferred through the ultra-high-vacuum (UHV) modular track 10, with a background pressure of about $5\times10^{-10}$ Torr, by a transfer arm to a surface-reconstruction chamber 13, which is an arsenic-free UHV chamber in this embodiment, for annealing to about 510° C. to obtain a Ga-rich (4×6) reconstructed surface (Step 22). It should be noted that when the substrate is not made of an III-V group compound semiconductor material, Step 22 may be omitted. In Step 25, GaAs(001)-4×6 wafers are in-situ transferred through the buffer chamber to the ALD chamber 14 including a customized ALD reactor for the deposition of a first high-κ dielectric layer, such as ALD-Al$_2$O$_3$ or other high-κ dielectric materials, on the reconstructed surface of the formed substrate; as such, native oxides have been completely eliminated. For the example of ALD-Al$_2$O$_3$, the process is carried out at a substrate temperature of 300° C. with Trimethylaluminum (TMA)/de-ionized H$_2$O as precursors. In addition, in-situ XPS and scanning tunneling microscopy (STM) analysis chambers are used for probing chemical/physical characteristics of surfaces of GaAs and interfaces of ALD-$Al_2O_3$/GaAs (Step 26). A series of ALD-$Al_2O_3$ samples of 1, 6, and 12 cycles are prepared. After the 1st and the 12th cycles of ALD-$Al_2O_3$, the samples are probed by reflection high-energy electron diffraction (RHEED) for the surface crystallography and STM for the morphological characterization.

Both the RHEED pattern and STM image demonstrate that the precursors (TMA and $H_2O$) in the first cycle of ALD-$Al_2O_3$ process reacted immediately with the GaAs surface (data not shown). As revealed by in-situ synchrotron-radiation photoemission studies, the TMA is physisorbed on charge-enriched surface As atoms and water then affects the TMA molecule in a way that allows the interfacial As to become an As—O—Al configuration, where the surface is further terminated with a hydroxyl group for $Al_2O_3$ to grow upon. In addition, water also removes the charge-deficient As atoms and causes the dimerized Ga to become oxidized.

Alternatively, according to the second embodiment, after Step 22, the samples could be in-situ transferred to the ALD chamber 14 for depositing a part of the first high-κ dielectric layer on the reconstructed surface of the substrate to a first thickness of about 0.15~1.5 nm (Step 23), and then the samples are in-situ transferred back to the surface-reconstruction chamber 13 so as to perform an in-situ vacuum annealing treatment at a temperature in a range of 300 to 700° C., preferably 450 to 550° C., which is decided by the adopted material of the substrate, and a pressure of $10^{-7}$ Torr or less (Step 24). The annealed samples are subsequently in-situ transferred to the ALD chamber 14 for further depositing the rest part of the first high-κ dielectric layer to a desired thickness so as to complete the formation of the first high-κ dielectric layer (Step 25).

Figure 3:
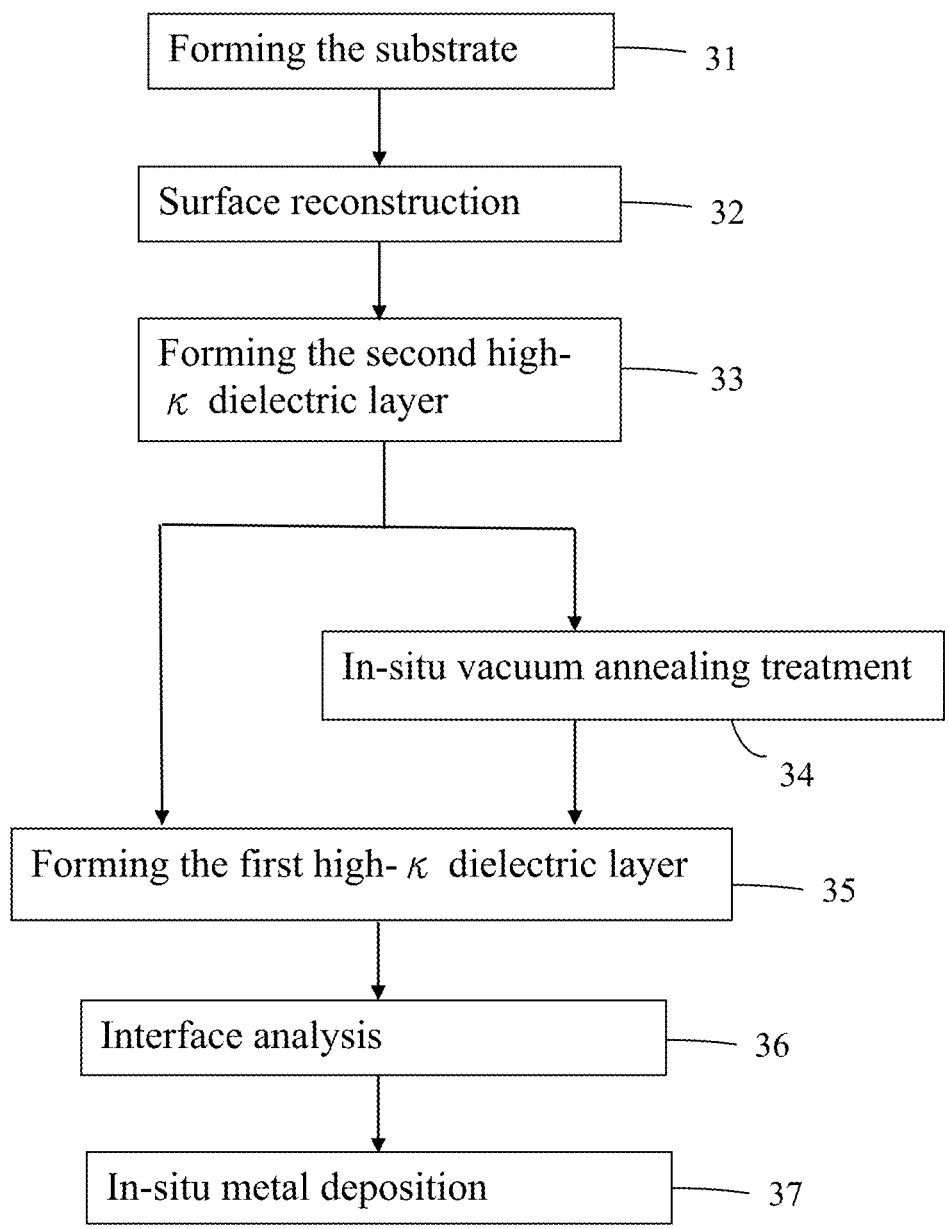
FIG. 3 is a flow chart showing a method for manufacturing a semiconductor device according to a third embodiment of the present invention.

Please refer to FIG. 3, which is a flow chart showing a method for manufacturing a semiconductor device according to a third embodiment of the present invention. The method is performed by using a system according to the first embodiment shown in FIG. 1. Steps 31 and 32 in this embodiment are similar to Steps 21 and 22 in the second embodiment and are not expatiated herein again. After Step 32, a second high-κ dielectric layer could be formed on the reconstructed surface in the surface-reconstruction chamber 13 by using e.g. the MBE method at a pressure ranged from $10^{-6}$~$10^{-9}$ Torr, preferably $10^{-8}$ Torr (Step 33). The method used for forming the second high-κ dielectric layer depends on the material of the second high-κ dielectric layer. In this aspect, the second high-κ dielectric layer could be formed by the ALD method in the ALD chamber 14 as well. The material or the forming method for the second high-κ dielectric layer could be the same with or different from that for the first high-κ dielectric layer. After Step 33, the samples are in-situ transferred through the modular track 10 and the buffer chamber 16 to, e.g. the ALD chamber 14, and the first high-κ dielectric layer is formed on the second high-κ dielectric layer therein (Step 35). Afterward, the analyses of the interfaces between layers are in-situ performed in the analysis chamber 18 (Step 36). Selectively, the in-situ vacuum annealing treatment in the surface-reconstruction chamber 13 at a temperature in a range of 300 to 700° C. (Step 34) could be performed between Steps 33 and 35. The second high-κ dielectric layer could act as an effective diffusion barrier/nucleation layer for the subsequent oxide layer, and avoid the formation of the native oxide layer on the surface of the substrate. However, it is not a certainty that the second high-κ dielectric is conducive to the performance of the first metal-oxide layer, and the necessity of the second high-κ dielectric layer could be decided by one skilled in the art based on the material used in the first high-κ dielectric layer.

As an example of the third embodiment, an epitaxial compound semiconductor layer (e.g. the p- and n-type $In_{0.53}Ga_{0.47}As$ layer with Be and Si dopants) is grown on single crystal compound semiconductor wafers (e.g. $P^+$ and $N^+$ epi-ready InP(001) wafers) so as to form the substrates (Step 31), and the wafers are in-situ transferred to the surface-reconstruction chamber 13 and heated up to ~460° C. to obtain (4×2)-reconstructed In/Ga stabilized $In_{0.53}Ga_{0.47}As$ (001) surfaces (Step 32). Then, samples are in-situ transferred to the ALD chamber 14 for the depositions of the second high-κ dielectric layer, i.e. ALD-$HfO_2$ (Step 33), and the first high-κ dielectric layer, i.e. ALD-HfAlO (Step 35) on the formed substrate, wherein the hafnium-based HfAlO with high re-crystallization temperature is employed as the top oxide capping layer to prevent the poly-crystalline formation in the dielectric while providing sufficient high dielectric constant. It is known that $HfO_2$ possesses much higher dielectric constant than that of $Al_2O_3$, and thus is critical for the EOT downscaling. 10-cycle ALD-$HfO_2$ (about 0.8 nm) is firstly deposited on the pristine $In_{0.53}Ga_{0.47}As$ surface, followed by the deposition of about 4.5 nm ALD-HfAlO with Tetrakis[EthylMethyl Amino]Hafnium (TEMAHf), trimethylaluminum (TMA) and de-ionized $H_2O$ as precursors. Both of the ALD-$HfO_2$ and ALD-HfAlO layers are as-deposited and annealed up to 800° C. for 10 seconds. High purity (99.9999%) nitrogen gas is used as the carrier gas. The deposition temperature for both $HfO_2$ and HfAlO is kept at about 320° C. Interfacial chemical analyses of ALD-$HfO_2$/$In_{0.53}Ga_{0.47}As$ interface is performed by using in-situ high-resolution XPS with an Al Kα (1486.7 eV) monochromatic x-ray source (Step 36). The instrumental resolution is better than 0.25 eV and a pass energy of 10 eV is employed. Metal-oxide-semiconductor capacitors (MOSCAPs) are made by e-beam evaporation of 60 nm-thick Ni electrodes through a shadow mask onto HfAlO for electrical characterization; the back electrodes for $P^+$ and $N^+$ substrates are AuBe/Ni and Ti/Pt/Au, respectively, formed via e-bam/thermal evaporation.

It would be appreciated that the embodiments in FIGS. 2 and 3 could further comprise steps of in-situ transferring the samples to a metal deposition chamber 15 via the modular track 10, and depositing at least one metal layer on the high-κ dielectric layer by ALD, sputtering deposition, evaporation deposition, and so on, e.g. the in-situ deposition of the metal layer (Step 37) on the first high-κ dielectric layer in the third embodiment. The material of the metal layer could be TiN, TaN, Ti, Al, W, Ni, Pt, Cu, Nitride-based metals or a combination thereof. Since the surface of the high-κ dielectric layer does not expose to the atmosphere before the deposition of the metal layer, a high-quality interface between the high-κ dielectric layer and the metal layer and the good performance of the oxide layer could thus be achieved.

Analyses of the Embodiments

Figure 4:
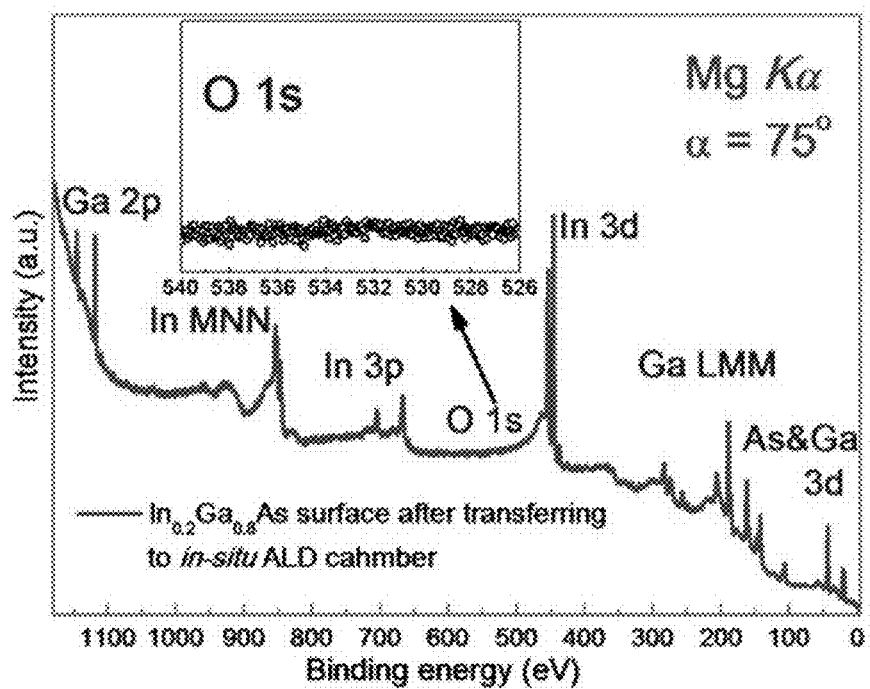
FIG. 4 is a diagram showing a survey photoemission spectrum of a freshly MBE grown $In_{0.2}Ga_{0.8}As$ surface after being in-situ transferred to ALD reactor.

Please refer to FIG. 4, which is a diagram showing a survey photoemission spectrum of the freshly MBE grown $In_{0.2}Ga_{0.8}As$ surface after being in-situ transferred to ALD reactor. Inset shows the fine scan spectrum of O 1s core level. Even with all the chambers in-situ connected, ALD is a process under low vacuum environment of a few Torr and at moderate growth temperatures, ranging in 200 to 400. Therefore, to ensure that GaAs-based semiconductors are not oxidized in such a circumstance, a reference MBE $In_{0.2}Ga_{0.8}As$ sample having a pristine surface is prepared and in-situ transferred to the ALD reactor, in which the pressure and temperature are set to about 1 Torr and 300° C., respectively, in $N_2$ ambiance to simulate the ALD-$Al_2O_3$ process. The surface chemistry of the reference sample is studied using the in-situ XPS. FIG. 4 illustrates the survey photoemission spectrum of the $In_{0.2}Ga_{0.8}As$ surface with a fine scan of O 1s core level shown in the inset. The spectra are taken with a take-off angle ($\alpha$) of 75° to maximize the surface sensitivity. Mg k$\alpha$ source is used to avoid the overlap of O 1s core level and Ga LMM auger signal. No sign of surface oxidation/contamination is observed, at least within the detection limit of XPS.

Figure 5:
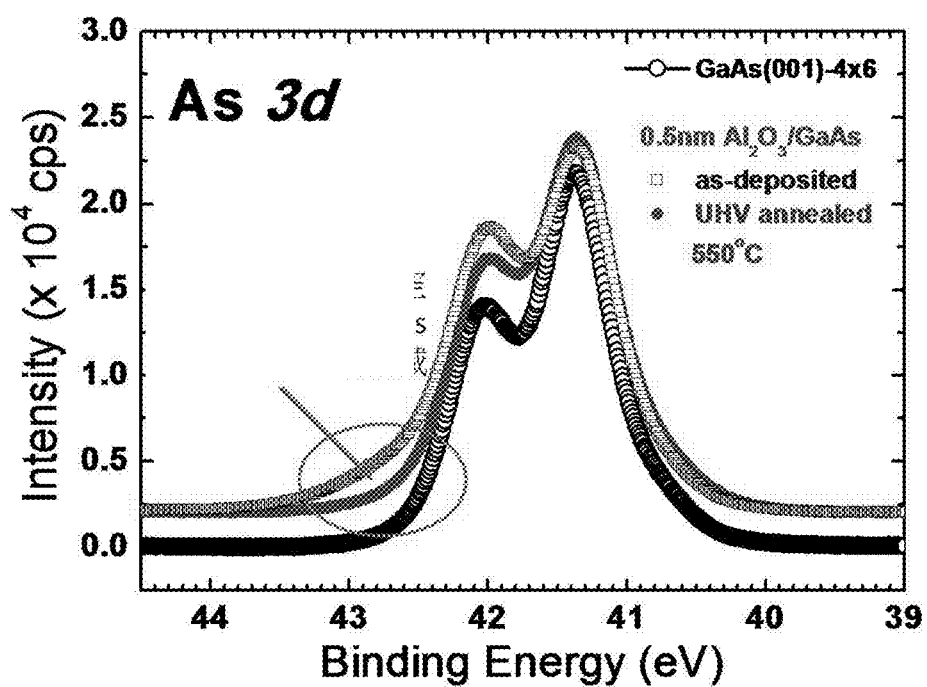
FIG. 5 is a diagram showing the As 3d core-level spectrum for ALD grown $Al_2O_3$ on GaAs(001)-4×6 manufactured according to the second embodiment with or without a in-situ vacuum annealing treatment.
Figure 6:
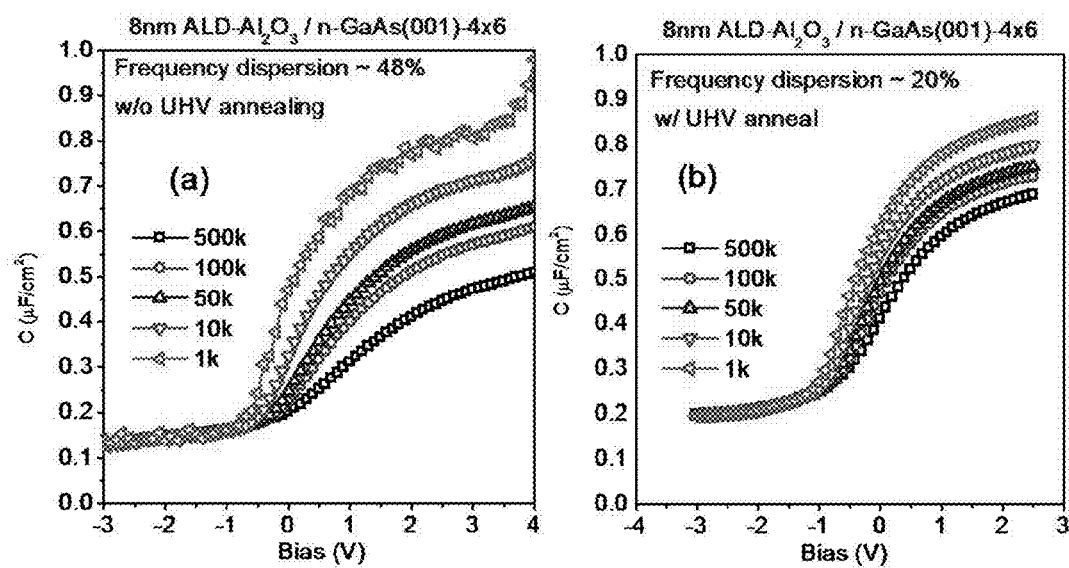
FIG. 6 is a diagram showing C-V characteristics for ALD grown $Al_2O_3$ on GaAs(001)-4×6 manufactured according to the second embodiment with or without the in-situ vacuum annealing treatment.
Figure 7A:
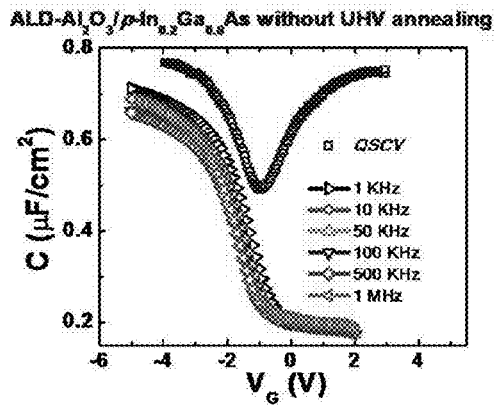
FIGS. 7A and 7B are diagrams showing quasi-static C-V characteristics for ALD grown $Al_2O_3$ on p- and n-$In_{0.2}Ga_{0.8}As$ respectively, manufactured according to the second embodiment without the in-situ vacuum annealing treatment.
Figure 7B:
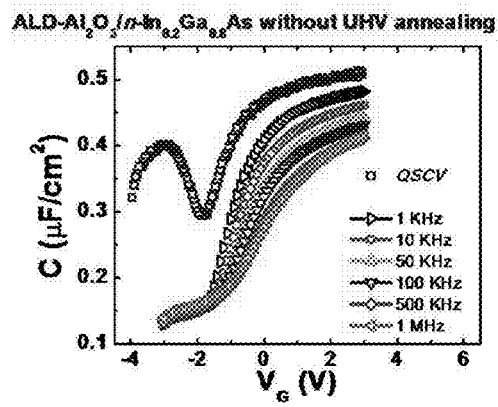
Figure 7C:
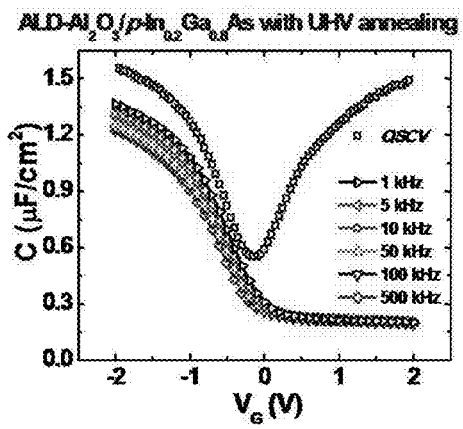
FIGS. 7C and 7D are diagrams showing quasi-static C-V characteristics for ALD grown $Al_2O_3$ on p- and n-$In_{0.2}Ga_{0.8}As$ respectively, manufactured according to the second embodiment with the in-situ vacuum annealing treatment.
Figure 7D:
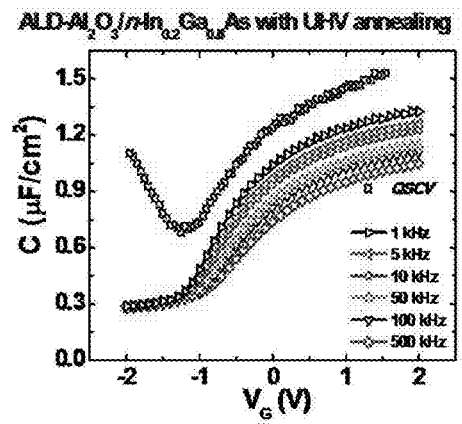
Figure 8:
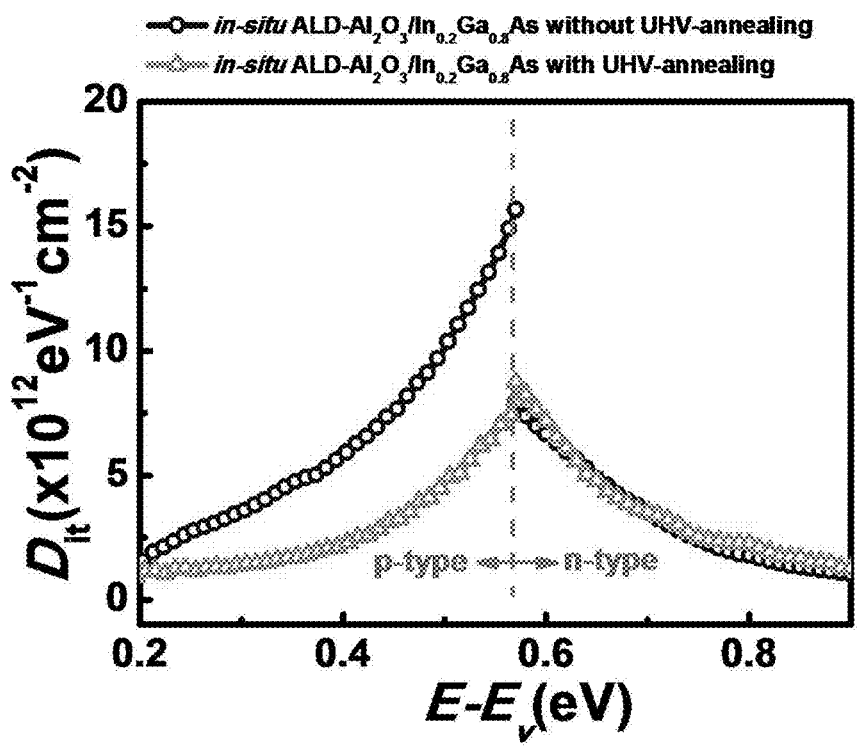
FIG. 8 is a diagram showing $D_{it}$ vs. bandgap of $In_{0.2}Ga_{0.8}As$ calculated by using the quasi-static C-V characteristics shown in FIGS. 7A, 7B, 7C and 7D.

Please refer to FIGS. 5 and 6, which are diagrams showing the As 3d core-level spectrum and the capacitance-voltage (C-V) characteristics for ALD grown $Al_2O_3$ (8 nm thick) on GaAs(001)-4×6 manufactured according to the second embodiment with or without the in-situ vacuum annealing treatment. The interface analysis result is obtained by using XPS. As shown by the arrow in FIG. 5, it could be known that the vacuum annealing treatment is effective in eliminating the deleterious As—As bonds at the interface, wherein the As—As bonds have been unanimously attributed as the causes for high interfacial density of states ($D_{it}$)'s, or $D_{it}$ peaks, in the band-gap of III-V materials. Further, as shown in FIG. 6, it could be seen that the C-V characteristics of the samples being treated with the in-situ vacuum annealing treatment exhibit a pronounced reduction in the frequency dispersion at accumulation, which means the $D_{it}$ of the interface between the oxide layer and the substrate is apparently improved. The similar results could be seen in the quasi-static CV (QSCV) analyses in FIGS. 7A, 7B, 7C and 7D. The $D_{it}$ vs. bandgap of $In_{0.2}Ga_{0.8}As$ shown in FIG. 8 is calculated by using the measurements of the QSCV analysis in FIGS. 7A-7D. P-substrate is used for the upper half of the bandgap, while n-substrate is used for the lower half. As shown in FIG. 8, compared to the ALD grown $Al_2O_3$ on $In_{0.2}Ga_{0.8}As$ without the in-situ vacuum annealing treatment, the $D_{it}$ value of the ALD grown $Al_2O_3$ on $In_{0.2}Ga_{0.8}As$ with the in-situ vacuum annealing treatment in the middle of the bandgap is successfully reduced from $10^{13}$ $cm^{-2}eV^{-1}$ to about $7\times10^{12}$ $cm^{-2}eV^{-1}$, which proves the effect of the in-situ vacuum annealing treatment on improving the $D_{it}$ of the interface between the oxide layer and the substrate.

Figure 9A:
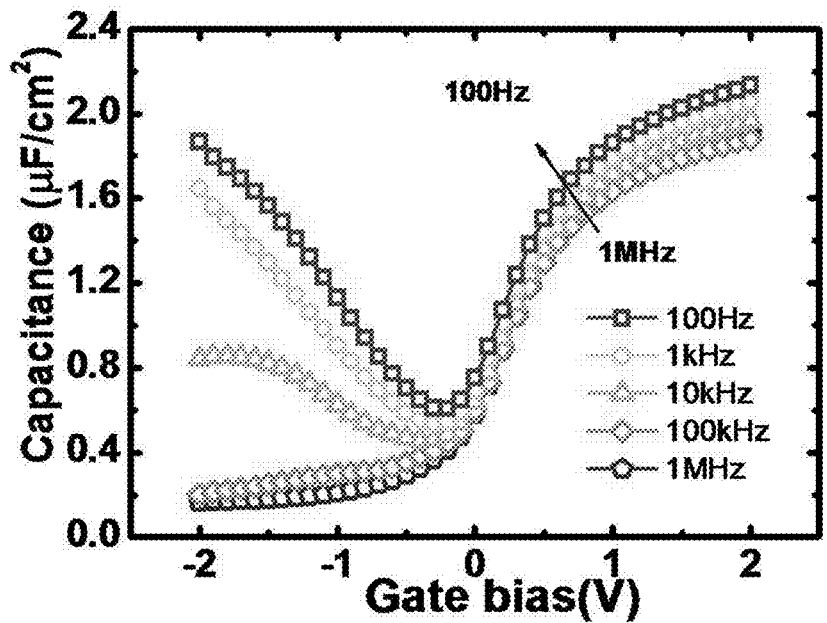
FIGS. 9A and 9B are diagrams showing C-V characteristics of the ALD-HfAlO/HfO$_2$ on n- and p-$In_{0.53}Ga_{0.47}As$ respectively, measured at a temperature of 300 K according to the third embodiment.
Figure 9B:
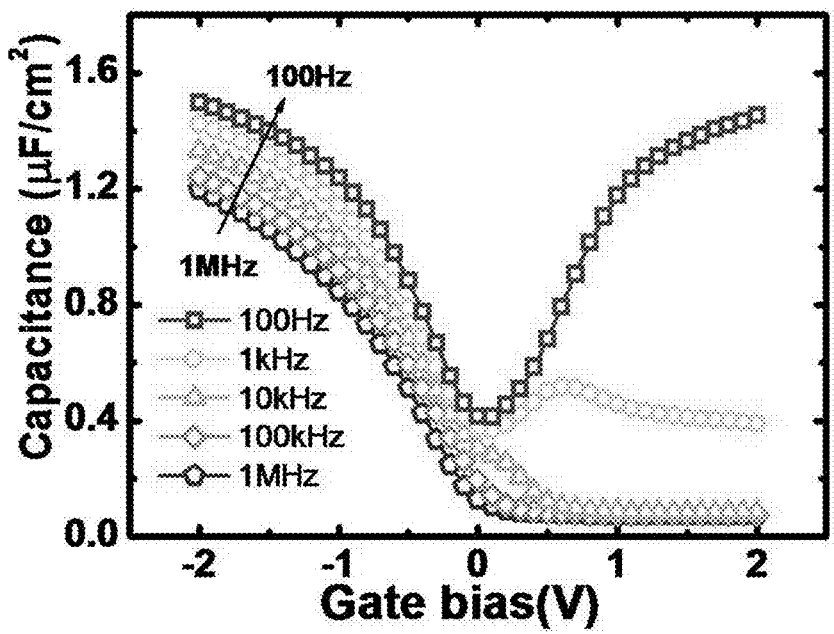

The analyses of the example of ALD-HfAlO/$HfO_2$ on n- and p-$In_{0.53}Ga_{0.47}As$ according to the third embodiment are described as follows. Based on the As 3p core-level spectra (data not shown), the integrity of the ALD-$HfO_2$/$In_{0.53}Ga_{0.47}As$ interface remains unaffected after the high-temperature annealing (about 800° C.), indicating that there was no severe degradation at the abovementioned interface and the interface has a thermodynamic stability at a high temperature of 800° C. Further, the ALD-HfAlO/$HfO_2$/$In_{0.53}Ga_{0.47}As$ MOSCAPs also exhibit $HfO_2$/$In_{0.53}Ga_{0.47}As$ interfaces free of arsenic-related defective bonding and low leakage current densities of $<10^{-7}$ $A/cm^2$ at ±1 MV/cm. $D_{it}$ spectra with low $D_{it}$'s and no mid-gap peaks is also revealed by measuring the temperature-dependent capacitance and conductance; $D_{it}$'s are at $2\sim3\times10^{12}$ $ev^{-1}cm^{-2}$ below and $6\sim12\times10^{11}$ $ev^{-1}cm^{-2}$ above the mid-gap gap of $In_{0.53}Ga_{0.47}As$. Moreover, the ALD-HfAlO/$HfO_2$ on n-$In_{0.53}Ga_{0.47}$ and p-$In_{0.53}Ga_{0.47}As$ also demonstrate good C-V characteristics (as shown in FIGS. 9A and 9B, respectively).

In view of the above embodiments and analysis results, it could be known that the in-situ approach described hereinbefore for manufacturing semiconductor devices where the surface of the pristine substrate is avoided from air-exposure plays an important role in reducing the residual oxides, improving the interfacial chemical and electrical characteristics and thus providing a high-quality interfaces between the oxide layer and the semiconductor layer. Accordingly, the method and system provided in the present invention using such in-situ approach could realize high performance MOSFETs.

Embodiments

1. A system for manufacturing a semiconductor device including a substrate and a dielectric layer on the substrate, comprising a modular track; a substrate-forming chamber connected with the modular track for forming the substrate; and an atomic layer deposition (ALD) chamber connected with the modular track for providing the dielectric layer.

2. The system of embodiment 1, wherein the modular track, the substrate-forming chamber and the ALD chamber are kept in ultra-high vacuum.

3. The system for manufacturing a semiconductor device including a substrate and a first dielectric layer on the substrate, comprising a substrate-forming chamber for forming the substrate; and an atomic layer deposition (ALD) chamber connected with the substrate-forming chamber for providing the first dielectric layer.

4. The system of embodiment 3, further comprising a modular track connected with the substrate-forming chamber, wherein the ALD chamber is connected with the substrate-forming chamber via the modular track.

5. The system of any of the preceding embodiments, wherein the modular track, the substrate-forming chamber and the ALD chamber are kept in ultra-high vacuum.

6. The system of any of the preceding embodiments, further comprising a load lock chamber connected with the modular track.

7. The system of any of the preceding embodiments, further comprising a surface-reconstruction chamber connected with the modular track.

8. The system of any of the preceding embodiments, wherein the semiconductor device further includes a second dielectric layer between the first dielectric layer and the substrate.

9. The system of any of the preceding embodiments, wherein the surface-reconstruction chamber is an ultra-high-vacuum (UHV) chamber for forming the second dielectric layer.

10. The system of any of the preceding embodiments, wherein the first dielectric layer and the second dielectric layer are formed of one of a same material and different materials.

11. The system of any of the preceding embodiments, further comprising an X-ray photoelectron spectroscopy (XPS) analysis chamber connected with the modular track.

12. The system of any of the preceding embodiments, wherein the substrate-forming chamber has a pressure in a range of $10^{-6}$ to $10^{-11}$ Torr.

13. The system of any of the preceding embodiments, wherein the substrate is formed from a III-V group compound semiconductor material including a III group chemical element and a V group chemical element, the III group chemical element includes one selected from a group consisting of B, Al, Ga, In and Tl, and the V group chemical element includes one selected from a group consisting of N, P, As, Sb and Bi.

14. The system of any of the preceding embodiments, wherein the substrate is formed of a material including one selected from a group consisting of Si, SiO$_2$, GaN, InGaN, AlN, sapphire, spinnel, SiC, GaAs, InGaAs, InAs, Al$_2$O$_3$, InP, and a combination thereof.

15. The system of any of the preceding embodiments, wherein the ALD chamber is connected with the modular track via a buffer chamber.

16. The system of any of the preceding embodiments, wherein the first dielectric layer includes a high-κ dielectric material including one selected from a group consisting of HfO$_2$, HfO$_2$-based dielectrics, ZrO$_2$, Al$_2$O$_3$, TiO$_2$, Sc$_2$O$_3$, La$_2$O$_3$, SrTiO$_3$, LaAlO$_3$, Y$_2$O$_3$, Ga$_2$O$_3$, Gd$_2$O$_3$, SiN and a combination thereof.

17. The system of any of the preceding embodiments, further comprising a metal deposition chamber connected with the modular track via a buffer chamber for providing a metal layer on the first dielectric layer.

18. The system of any of the preceding embodiments, wherein the metal deposition chamber includes an ALD reactor.

19. A method for manufacturing a semiconductor device, comprising steps of forming a substrate; and forming a first dielectric layer on the substrate in an atomic layer deposition (ALD) chamber, wherein the formed substrate is kept in vacuum before forming the first dielectric layer.

20. The method of embodiment 19, further comprising steps of providing a modular track connected with a substrate-forming chamber for forming the substrate and connected with the ALD chamber; keeping the modular track, the substrate-forming chamber and the ALD chamber in ultra-high vacuum; and providing a surface-reconstruction chamber connected with the modular track.

21. The method of any of the preceding embodiments, further comprising steps of performing a surface reconstruction process to the substrate in the surface-reconstruction chamber; and providing a second dielectric layer on the substrate in the surface-reconstruction chamber prior to forming the first dielectric layer.

22. The method of any of the preceding embodiments, wherein the step of forming the first dielectric layer includes a sub-step of depositing the first dielectric layer on the substrate to a first thickness of 0.5~1.5 nm, and the method further comprises steps of performing a vacuum annealing treatment at a temperature in a range of 300 to 700° C. in the surface-reconstruction chamber after depositing the first dielectric layer to the first thickness; and further depositing the first dielectric layer to a second thickness in the ALD chamber.

23. A method of any of the preceding embodiments, further comprising steps of controlling a first pressure ranged from 10$^{-9}$ to 10$^{-11}$ Torr in the modular track; and controlling a second pressure ranged from 10$^{-6}$ to 10$^{-11}$ Torr in the substrate-forming chamber.

24. A method of any of the preceding embodiments, further comprising steps of providing a metal deposition chamber connected with the modular track via a buffer chamber; and providing a metal layer on the first dielectric layer in the metal deposition chamber.

25. The method of any of the preceding embodiments, further comprising a step of performing a surface reconstruction process to the substrate in the surface-reconstruction chamber prior to forming the first dielectric layer.

26. The method of any of the preceding embodiments, further comprising steps of providing a second dielectric layer on the substrate in the surface-reconstruction chamber; and performing a vacuum annealing treatment at a temperature in a range of 300 to 700° C. in the surface-reconstruction chamber prior to forming the first dielectric layer.

While the invention has been described in terms of what is presently considered to be the most practical and preferred embodiments, it is to be understood that the invention needs not be limited to the disclose embodiments. Therefore, it is intended to cover various modifications and similar arrangements included within the spirit and scope of the appended claims, which are to be accorded with the broadest interpretation so as to encompass all such modifications and similar structures.

What is claimed is:

1. A method for manufacturing a semiconductor device, comprising steps of:
    forming a substrate; and
    forming a first dielectric layer on the substrate in an atomic layer deposition (ALD) chamber, wherein the formed substrate is kept in vacuum before forming the first dielectric layer.

2. The method as claimed in claim 1, further comprising steps of:
    providing a modular track connected with a substrate-forming chamber for forming the substrate and connected with the ALD chamber;
    keeping the modular track, the substrate-forming chamber and the ALD chamber in ultra-high vacuum; and
    providing a surface-reconstruction chamber connected with the modular track.

3. The method as claimed in claim 2, further comprising steps of:
    performing a surface reconstruction process to the substrate in the surface-reconstruction chamber; and
    providing a second dielectric layer on the substrate in the surface-reconstruction chamber prior to forming the first dielectric layer.

4. The method as claimed in claim 2, wherein the step of forming the first dielectric layer includes a sub-step of
    depositing the first dielectric layer on the substrate to a first thickness of 0.5~1.5 nm, and the method further comprises steps of:
    performing a vacuum annealing treatment at a temperature in a range of 300 to 700° C. in the surface-reconstruction chamber after depositing the first dielectric layer to the first thickness; and
    further depositing the first dielectric layer to a second thickness in the ALD chamber.

5. The method as claimed in claim 2, further comprising steps of:
    controlling a first pressure ranged from 10$^{-9}$ to 10$^{-11}$ Torr in the modular track; and
    controlling a second pressure ranged from 10$^{-6}$ to 10$^{-11}$ Torr in the substrate-forming chamber.

6. The method as claimed in claim 2, further comprising steps of:
    providing a metal deposition chamber connected with the modular track via a buffer chamber; and
    providing a metal layer on the first dielectric layer in the metal deposition chamber.

* * * * *